United States Patent
Aizawa et al.

(10) Patent No.: US 6,820,047 B1
(45) Date of Patent: Nov. 16, 2004

(54) METHOD AND SYSTEM FOR SIMULATING AN OPERATION OF A MEMORY

(75) Inventors: Hideo Aizawa, Hamura (JP); Makoto Kishino, Akiruno (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 851 days.

(21) Appl. No.: 09/659,584

(22) Filed: Sep. 11, 2000

(30) Foreign Application Priority Data

Nov. 5, 1999 (JP) .......................................... 11-315884

(51) Int. Cl.⁷ .............................................. G06F 17/50
(52) U.S. Cl. ............................. 703/14; 703/21; 703/24; 714/33; 714/41; 714/718; 714/741; 714/819; 711/144
(58) Field of Search ...................... 703/13, 14, 20–22, 703/23–25; 714/25, 33, 41, 805, 800, 799, 740, 768, 763, 718, 819, 752, 42, 53, 54; 716/4; 711/144, 210; 365/189.01, 189.04

(56) References Cited

U.S. PATENT DOCUMENTS

| | | | | |
|---|---|---|---|---|
| 4,354,225 A | * | 10/1982 | Frieder et al. .................. | 711/5 |
| 4,617,660 A | * | 10/1986 | Sakamoto ....................... | 714/6 |
| 4,800,563 A | * | 1/1989 | Itagaki et al. .................. | 714/6 |
| 5,337,317 A | * | 8/1994 | Takamisawa et al. ........ | 714/766 |
| 5,671,352 A | * | 9/1997 | Subrahmaniam et al. ..... | 714/41 |
| 5,875,195 A | * | 2/1999 | Dixon ......................... | 714/719 |
| 6,012,157 A | * | 1/2000 | Lu .............................. | 714/741 |
| 6,053,948 A | * | 4/2000 | Vaidyanathan et al. ....... | 703/14 |
| 6,144,930 A | * | 11/2000 | Kinzelman .................... | 703/13 |
| 6,539,503 B1 | * | 3/2003 | Walker ........................ | 714/703 |

FOREIGN PATENT DOCUMENTS

| | | | | |
|---|---|---|---|---|
| JP | 56011700 A | * | 2/1981 | ........... G11C/29/00 |
| JP | 57066597 A | * | 4/1982 | ........... G11C/29/00 |
| JP | 6-162131 | | 6/1994 | ........... G06F/15/60 |
| JP | 6-90713 | | 11/1994 | ........... G11C/29/00 |

* cited by examiner

Primary Examiner—Anthony Knight
Assistant Examiner—Crystal J Barnes
(74) Attorney, Agent, or Firm—Finnegan, Henderson, Farabow, Garrett & Dunner, L.L.P.

(57) ABSTRACT

A simulation system simulates an operation of a memory. This system includes an error generating step in addition to a memory operation simulating step. An error can easily be generated in a read/write operation of a memory model only by setting a memory address. A set of free bits, which is not used for the simulation of a memory operation, is used as a memory address for indicating the error generation. It is thus unnecessary to prepare a new description of a signal line exclusively for indication of error generation and it is possible to simulate a memory operation containing an error only by the normal descriptions of an address, data, and the like.

12 Claims, 7 Drawing Sheets

| | PAGE 1 | ECC |
|---|---|---|
| | 2 | ECC |
| | 3 | ECC |
| | 4 | ECC |

| | TMA | TEST_ADDR | | PA | MA |
|---|---|---|---|---|---|
| NAND ADDRESS | 23:22 | 21 | 20:12 | 11 | 10:09 | 08:00 |
| NORMAL | 00 | * | * | * | PAGE SELECT | COLUMN ADDRESS |
| FAIL | FAIL MODE | * | FAIL ADDRESS | * | PAGE SELECT | COLUMN ADDRESS |

| W/R | NAND ADDRESS <23:22> | MODE | FAIL DATA |
|---|---|---|---|
| WRITE | 00 | PASS | NORMAL |
| | 01 | 1 BIT_FAIL | DATA <07> IS INVERT |
| | 10 | 2 BIT_FAIL | DATA <07:06> IS INVERT |
| | 11 | 3 BIT_FAIL | DATA <07:05> IS INVERT |
| READ | 00 | PASS | NORMAL |
| | 01 | 1 BIT_FAIL | DATA <07> IS INVERT |
| | 10 | 2 BIT_FAIL | DATA <07:06> IS INVERT |
| | 11 | 3 BIT_FAIL | DATA <07:05> IS INVERT |

METHOD AND SYSTEM FOR SIMULATING AN OPERATION OF A MEMORY

CROSS-REFERENCE TO RELATED APPLICATIONS

This application is based upon and claims the benefit of priority from the prior Japanese Patent Application No. 11-315884, filed Nov. 5, 1999, the entire contents of which are incorporated herein by reference.

BACKGROUND OF THE INVENTION

The present invention relates to a method and a system for simulating an operation of a memory and, more specifically, to a method and a system which are so improved that an error operation of a memory can be simulated.

As hardware to be designed, such as an LSI, increases in size, a design technique of describing functional specifications of the hardware by computer programs such as hardware description language and simulating an operation of the hardware, has recently been established. The simulation technique using such software allows the operation of a development-targeted LSI to be verified with efficiency.

In order to verify the operation of an LSI having a memory control function, an external memory model describing the operation of a memory to be controlled should be prepared in addition to a functional model of the LSI. The external memory model is generally based on a memory capable of correctly reading out the write data. This is because in most normal semiconductor memory devices such as at DRAM and a SRAM, no errors occur in the read/write operation and the write data can correctly be read out. The operation of the, LSI can thus be verified correctly, provided that an external memory model which reads out write data has only to be prepared.

However, semiconductor memory devices, which is not always able to correctly read out write data like a flash memory (flash EEPROM), have recently started to increase and accordingly a system having a function of detecting a memory error need to be developed. For example, in a memory system using a flash memory, an ECC (error correcting code) is generated in units of write data and stored in a flash memory together with write data and, when data is read out, a memory controller detects and corrects an error of the read data in accordance with the ECC.

To correctly verify the operation of the memory controller, a new external memory model having an error generating function should be prepared.

BRIEF SUMMARY OF THE INVENTION

An object of the present invention is to provide a method and a system capable of easily simulating an error operation of a memory.

Another object of the present invention is to provide a method and a system which are the most suitable for verifying an operation of a memory system using a nonvolatile semiconductor memory such as a flash memory.

In order to resolve the above objects, the present invention is provided with a method of simulating an operation of a memory, comprising the steps of simulating a read/write operation corresponding to a location specified by a first bit set of a memory address including a plurality of bits, using a memory model describing the operation of the memory, and generating an error in the read/write operation of the memory model in accordance with a value of a second bit set of the memory address by making a change to one of write data to be written to the memory model and read data read therefrom, the second bit set being not used for the simulation of the read/write operation using the memory model.

The above simulation method includes an error generating step in addition to a memory operation simulating step. An error can easily be generated in a read/write operation of a memory model only by setting a memory address. A second bit set, which is not used for the simulation of a memory operation, is used as a memory address for indicating the error generation. It is thus unnecessary to prepare a new description of a signal line exclusively for indication of error generation and it is possible to simulate a memory operation containing an error only by the normal descriptions of an address, data, and the like. An error of a memory operation is generated by making a change, such as bit reverse, to write data to be written to the memory model or read data read therefrom. It is thus unnecessary to make a change to a normal memory model itself which correctly reads out write data, and it is possible to simulate an error operation of a memory only by adding a functional description such as bit reversal of write data/read data to the memory model.

It is preferable to define a set of bits for specifying an error generating address and another set of bits for specifying error mode in the second bit set which is not used for the simulation of the memory operation. The error generating step allows an error to be generated in an address position in accordance with a value of the second bit set of the memory address.

When the memory model describes an operation of a nonvolatile semiconductor memory to which write data and an error correction code thereof are written in units of data size, it is preferable to further comprise a step of simulating an error correcting operation of a memory controller for controlling the nonvolatile semiconductor memory, based on the read data read from the memory model and the error correction code, using an LSI model describing an operation of the memory controller. It is thus possible to verify an error correcting operation of the memory controller for controlling a nonvolatile semiconductor memory such as a flash memory.

When an error correcting operation of the memory controller is simulated, it can be verified from various angles by selectively using a first error mode in which data is changed within the number of error correctable bits by an error correction code and a second error mode in which data is changed by the number of bits exceeding the number of error correctable bits by the error correction code.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to the accompanying drawings.

Figure 1:
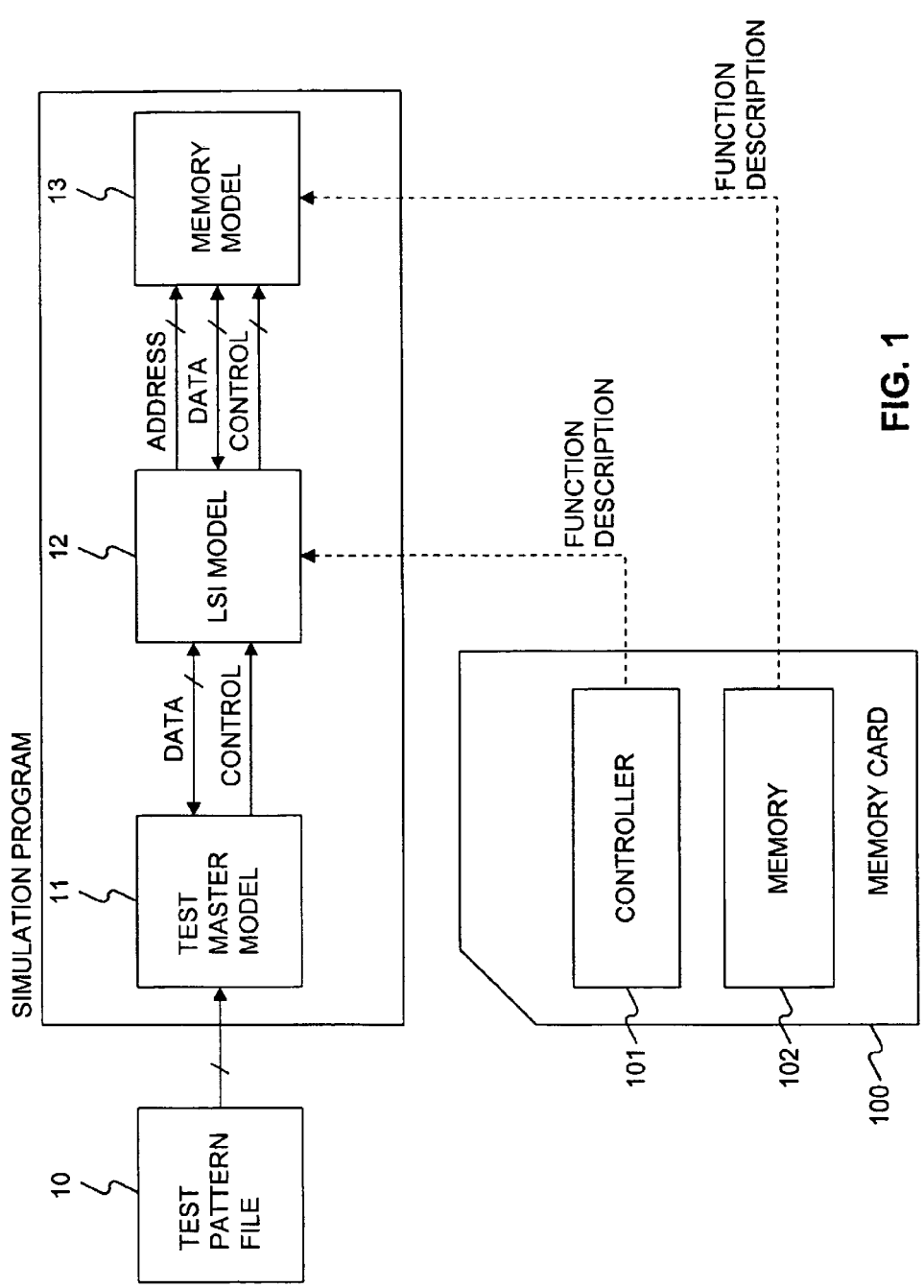
FIG. 1 is a block diagram showing a structure of a simulation system according to an embodiment of the present invention.

FIG. 1 shows a function of a simulation system according to the embodiment of the present invention. The simulation system is used for verifying an operation of an LSI having a memory control function and targeted for development, and the system is realized by computer programs (simulation programs) for simulating an LSI operation in accordance with a test pattern read out of a test pattern file 10.

The simulation program is used to simulate an operation of hardware on a computer in accordance with descriptions of the hardware using a hardware description language. Verilog HDL and VHDL are usable for the hardware description language.

As illustrated in FIG. 1, the simulation program includes a test master model 11, an LSI model 12, and a memory model 13. These models describe the operation of the hardware, and a simulation operation is carried out in accordance with the descriptions of the models.

In the present embodiment, it is assumed that the LSI model 12 and memory model 13 are functional models describing operations of a controller 101 and a memory 102 embedded in a memory card 100. The memory card 100 contains a memory 102 constituted of a nonvolatile semiconductor memory such as a NAND type flash EEPROM. The memory card 100 is used as a removable recording medium for computers and electronic equipment. The controller 101 is designed to control an operation of a NAND flash EEPROM at the request of a host device (a computer and electronic equipment) on which the memory card 100 is mounted.

The test master model 11 is a model describing an operation of a CPU and a PCI bus master on a host device for controlling an LSI targeted for development. The test master model 11 controls the memory card 100. The test master model 11 has a function of reading a test pattern from the test pattern file 10 and issuing a control signal (CONTROL) for controlling the LSI model 12 and a function of transmitting/receiving memory data (DATA) to/from the LSI model 12.

The LSI model 12 is a model describing an operation of a development-targeted LSI having a control function of the memory model 13, and it has a function of issuing a memory address (ADDRESS) and a memory control signal (CONTROL) to the memory model 13 and a function of transmitting/receiving memory data (DATA) to/from the memory model 13. The LSI model 12 has an ECC generation function of generating an ECC (error-correcting code) corresponding to write data and an ECC check function of detecting and correcting an error in accordance with read data and its accompanying ECC contents.

The memory model 13 is a model describing a memory operation controlled by an LSI targeted for development or an operation of the memory 102 of the memory card 100. The memory model 13 has a function of generating an error in data read/write operations. In the error generating function, an error is generated in the read/write operations by making changes (bit reversal) to write data supplied to the memory model 13 or read data read out of the memory model 13. The error generating function is controlled by a bit set other than a bit set used in the memory simulation operation using the memory model 13 within the memory address (ADDRESS). In other words, the range of the memory address used in the memory simulation using the memory model 13 is limited, and a memory address beyond the range is used for controlling the error generating function.

A specific structure of the memory model 13. With an error generating function will now be described with reference to FIG. 2.

Figure 2:
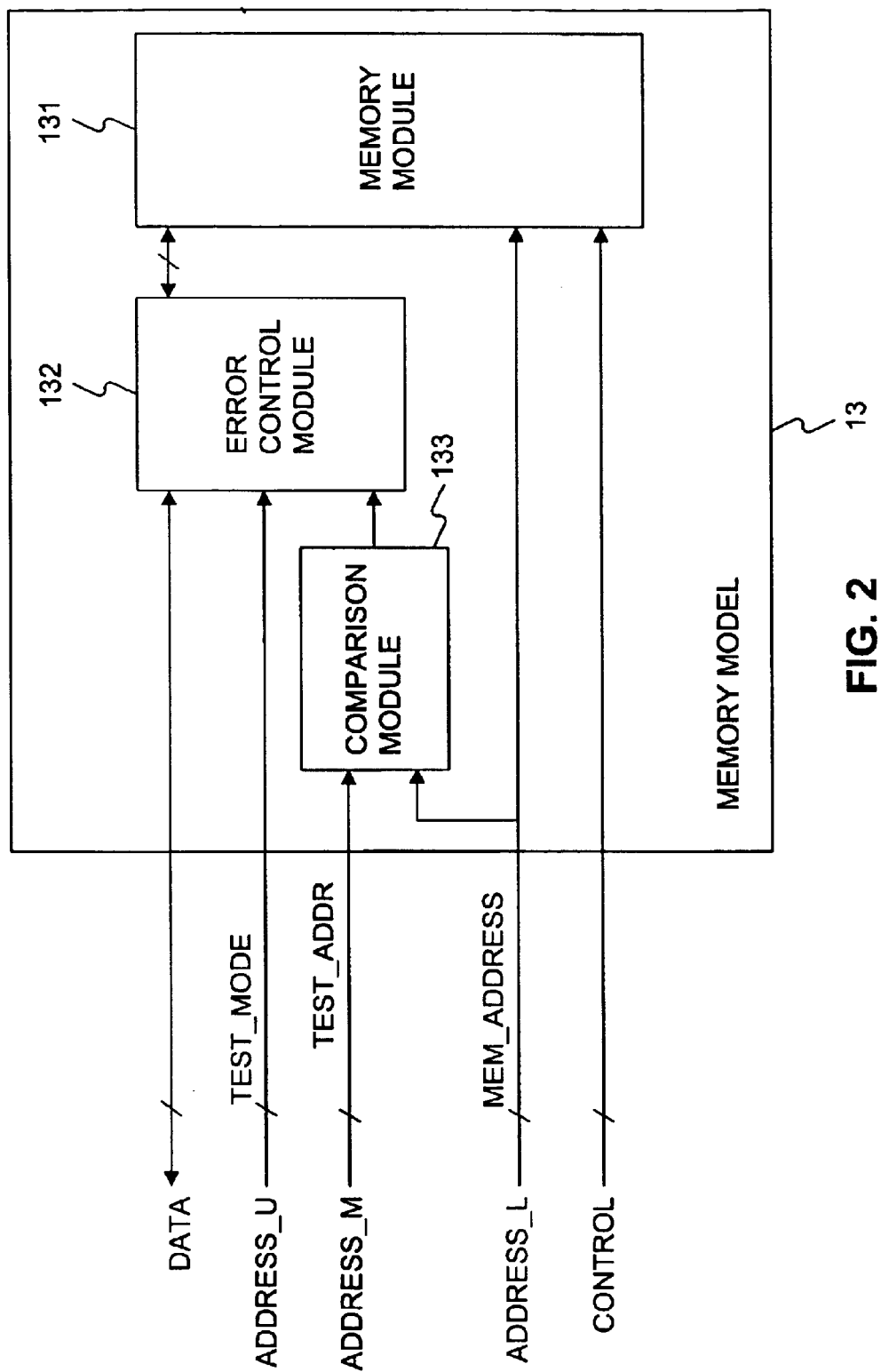
FIG. 2 is a block diagram showing a function of a memory model used in the simulation system according to the embodiment of the present invention.

As shown in FIG. 2, the memory model 13 includes a memory module model 131, an error control module 132, and a comparison module 133.

The memory module model 131 is a model describing an operation of a NAND flash EEPROM constituting the memory 102 shown in FIG. 1. This model is predicated on a memory capable of correctly reading write data. Since the memory model 13 requires no memory space for conducting a test on all memory address spaces of the NAND flash EEPROM, only the memory address space, which can be designated by the lower bit set (ADDRESS_L) of the memory address (ADDRESS), is defined in the memory module 131.

Only the lower bit set (ADDRESS_L) of the memory address (ADDRESS) issued from the LSI model 12 shown in FIG. 1, is supplied to the memory module model 131 as an effective memory address (MEM_ADDRESS) for accessing to the memory module model 131.

The error control module 132 is a functional model for executing data chancre processing, such as 1-bit reversal, 2-bit reversal and 3-bit reversal, for write data supplied from the LSI model 12 shown in FIG. 1 to the memory module model 131 or read data supplied from the memory module model 131 to the LSI model 12. The higher bit set (ADDRESS_U) of the memory address (ADDRESS) from the LSI model 12 is sent to the error control module 132 as a test mode designating information (TEST_MODE). The way of changing data is designated by the test mode designating information (TEST_MODE).

A medium bit set (ADDRESS_M) of the memory address (ADDRESS) is supplied from the LSI model 12 to the comparison module 133 as test address information (TEST_

ADDR), and so is the effective memory address (MEM_ADDRESS) described above. The test address information (TEST_ADDR) is used to specify an address on which one desires to generate an error (a location on the memory module 131). When a location designated by the test address information (TEST_ADDR) and a location designated by the effective memory address (MEM_ADDRESS) coincide with each other, the error control module 132 performs a data change operation.

A simulation operation of a memory operation using the memory model 13 comprises a normal memory operation simulating step and an error generating step. In the memory operation simulating step, the memory module 131 simulates a normal read/write operation for the location designated by the lower bit set (ADDRESS_L) of the memory address (ADDRESS). In the error generating step, an error is generated on write/read data, by the functions of the error control module 132 and comparison module 133.

In the error generating step, a location on which one desires to generate an error can be designated by the medium bit set (ADDRESS_M) of the memory address, and the contents (1-bit error, 2-bit error, 3-bit error) of an error to be caused can be designated by the higher bit set (ADDRESS_U) of the memory address (ADDRESS).

Since the memory address (ADDRESS) from the LSI model 12 is one described in the test pattern file 10, various errors can be generated in any storage location in the memory module model 131 by setting the medium bit set (ADDRESS_M) and higher bit set (ADDRESS_U) described in the test pattern file 10.

The structure of the NAND type flash EEPROM, actually controlled by the development-targeted LSI 12 and the memory address space assigned to the memory module model 131, will now be described.

Figure 3:
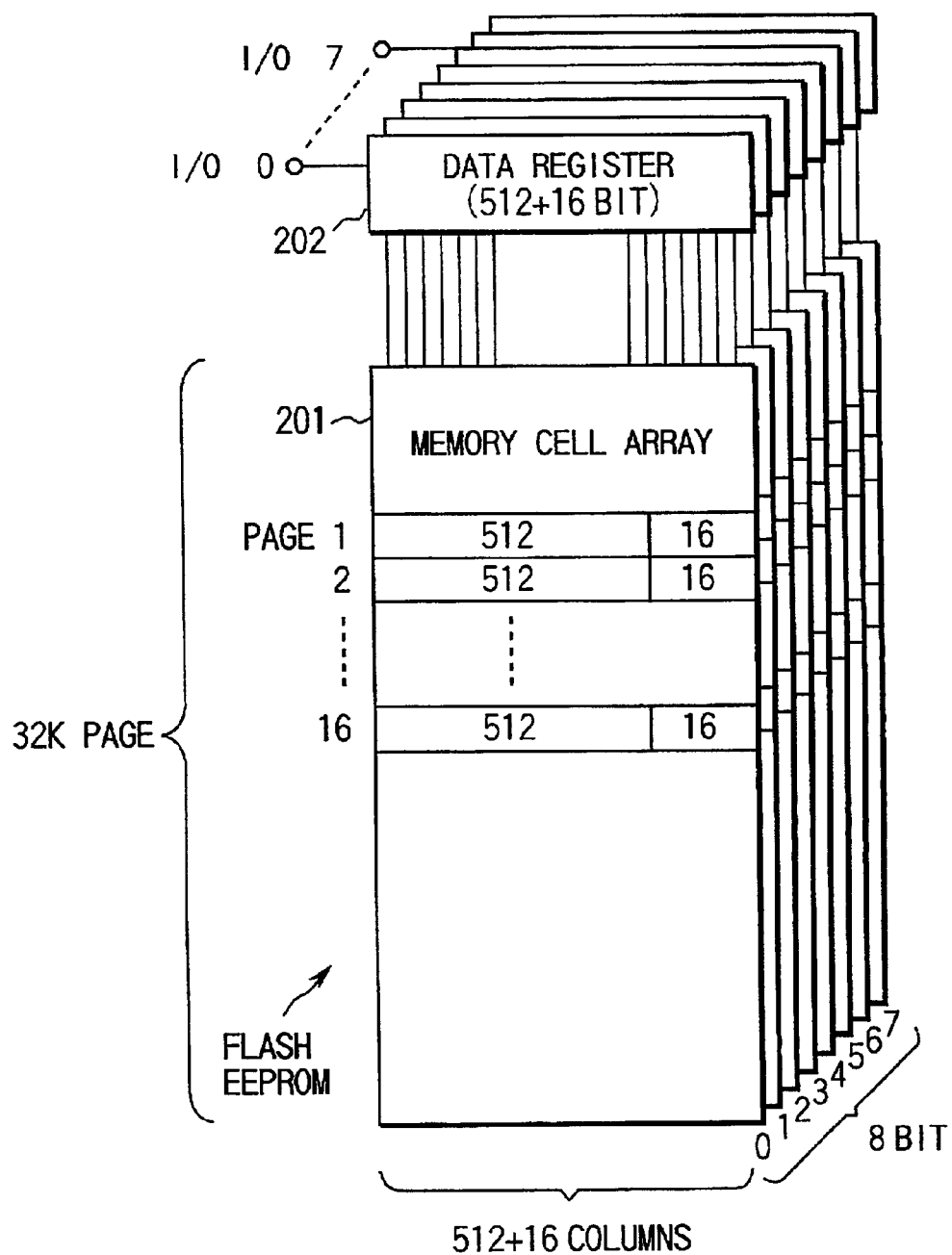
FIG. 3 is a view showing a specific example of the structure of a flash EEPROM in a memory card whose operation is verified in the simulation system according to the embodiment of the present invention.

FIG. 3 illustrates a specific example of the structure of a NAND type flash EEPROM. This EEPROM includes a memory cell array 201 and a data register 202. The memory cell array 201 has a bit configuration of, e.g., 32K pages (rows) ×528 columns (528=512+16)×8 bits. Each of the pages includes a 512-byte data storage region and a 16-byte (or more) redundant region. Basically the write/read operation is performed for each page by means of the data register 202. The redundant region is used for storing an ECC corresponding to data in the data storage region. The size of the redundant region varies from memory chip to memory chip.

The NAND type flash EEPROM includes a write mode, a read mode and an erase mode. These modes are designated by a control signal and a command from the controller 101.

In the read mode, data can be read in units of page and, in this case, data of one page (512+16) is transferred together from the memory cell array 201 to the data register 202. The data of one page is read out of the data register 202, via input/output terminals I/O 0–7, sequentially in units of 8 bits, the terminals I/O 0–7 being used for inputting an address and inputting/outputting data. The readout of data from the data register 202 is executed while column addresses are automatically incremented in sequence in the NAND type flash EEPROM. Needless to say, data can be read from any position within a page and from a boundary between pages.

In the write mode, too, data can be written in units of page and, in this case, write data is written via the input/output terminals I/O 0–7 to the data register 202 in sequence in units of 8 bits. This writing is also executed while column addresses are automatically incremented in sequence in the NAND type flash EEPROM. If write data (512+16) of one page is completed, they are transferred together from the data register 202 to the memory cell array 201. Needless to say, in the write mode, too, data can be read from any position within a page and from a boundary between pages.

Figures 4, 5:
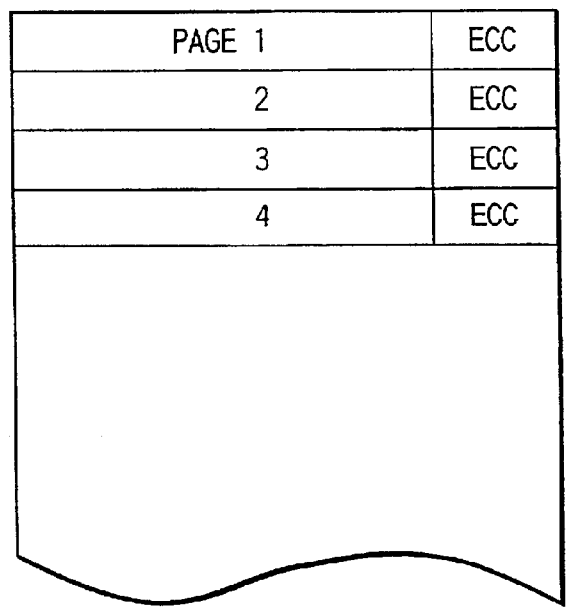
FIG. 4 is a diagram showing an example of a memory address space assigned two the memory model used in the simulation system according to the embodiment of the present invention.
FIG. 5 is a table showing an example of memory address matching in the simulation system according to the embodiment of the present invention.

FIG. 4 shows an example of a memory address space assigned to the memory module model 131. Only the memory address space for the first four pages (pages 1 to 4) of the 32K pages is assigned to the memory module model 131.

An operation test for memories using the memory module model 131, that is, a memory operation simulation is performed within the memory address space for the four pages (pages 1 to 4).

Referring now to FIG. 5, a specific method of using a memory address in the present embodiment will be described.

The memory address (NAND ADDRESS) for the NAND type flash EEPROM is 24 bits (23:00). The lower 9 bits (08:00) are used as a column address (MA) representing a storage position in a page of the memory module model 131, while the next-lower 2 bits (10:09) are used as a page select address (PA) for selecting one of four pages in the memory module model 131. In other words, the memory address assigned to the memory module model 131 is the lowest 11 bits (10:00) of the memory address (NAND ADDRESS). The highest 2 bits (23:22) of the memory address (NAND ADDRESS) are a test mode designation address (TMA) used as the above-described test mode designating information (TEST_MODE). The highest 2 bits (23:22 ="00") specifies a normal operation (NORMAL) and, in this case, the error control module 132 does not perform its data change operation. Three combinations other than the highest 2 bits (23:22) each designates an error operation (FAIL MODE). The error operation (FAIL MODE) is shown specifically in FIG. 6.

The error control module 132 defines four operation modes for each of write and read. In the write mode, when the highest 2 bits (23:22) are equal to "00", the error control module 132 operates in a PASS mode to supply write data to the memory module model 131 as it is. When they are equal to "01", the module 132 operates in a 1-bit_Fail mode to reverse the highest bit (07) of one-byte write data and then supply the write data including the reversed bit to the memory module model 131. When they are equal to "10", the module 132 operates in a 2-bit_Fail mode to reverse the higher 2 bits (07:06) of one-byte write data and then supply the write data including the reversed bits to the model 131. Further, when they are equal to "11", the module 132 operates in a 3-bit_Fail mode to reverse the higher 3 bits (07:05) of one-byte write data and then supply the write data including the reversed bits to the model 131.

Since it is not more than a 2-bit error that can be recovered by an ECC, the error detecting and correcting function of the LSI model 12 can be verified from various angles by selectively using the 1-bit_Fail, 2-bit_Fail, and 3-bit_Fail modes.

In the read mode, too, the PASS mode, 1-bit_Fail mode, 2-bit_Fail mode, and 3-bit_Fail mode are defined.

In FIG. 5, the medium 9 bits (20:12) of the memory address (NAND ADDRESS) are addresses used as the test address information (TEST_ADDR) described above. These addresses (TEST_ADDR) are compared with the column addresses of the lower 9 bits (08:00) by the foregoing comparison module 133. When a column address value of the lower 9 bits (08:00) coincides with the memory address (TEST_ADDR) designated by the medium 9 bits (20:12), the error control module 132 operates in accordance with the highest 2 bits (23:22).

Figures 6, 7:
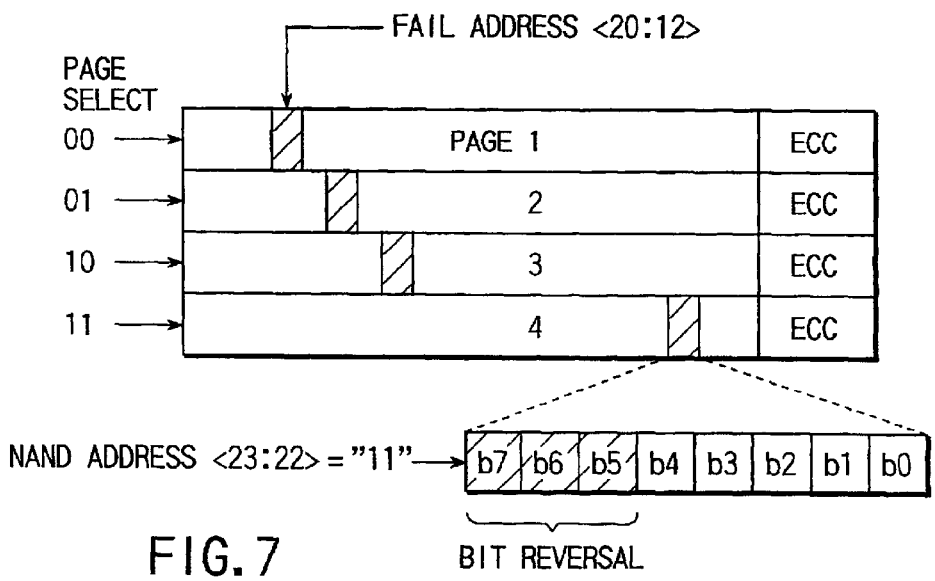
FIG. 6 is a table illustrating an error mode of the simulation system according to the embodiment of the present invention.
FIG. 7 is a diagram showing an example of error occurring position control in the simulation system according to the embodiment of the present invention.

In page read/page write, the column address values of the lower 9 bits (08:00) are sequentially updated by +1 starting from the address value designated by the LSI model 12, so that one-byte data corresponding to a column position specified by the FAIL_ADDRESS of the medium 9 bits (20:12) is selected from those of a page as a target to be changed. Consequently as illustrated in FIG. 7, an error can be generated on data in a column position within a page specified by a page select address by setting a value of the FAIL_ADDRESS of the medium 9 bits (20:12). The contents of the error depend upon the value of the highest 2 bits (23:22).

The steps of a simulation performed by simulation programs of the present Embodiment will now be described with reference to the flowcharts shown in FIGS. 8 and 9.

Figure 8:
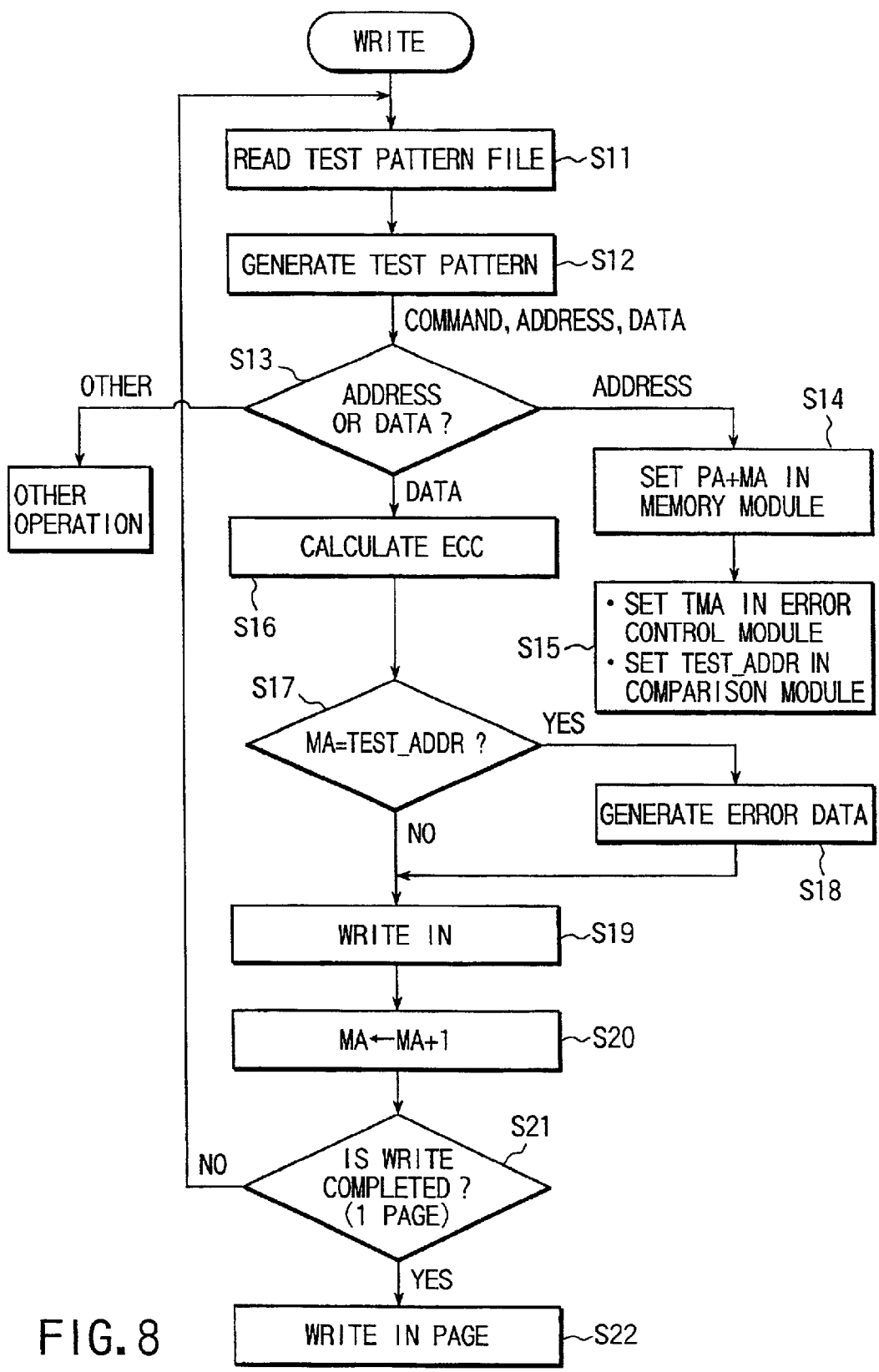
FIG. 8 is a flowchart showing a simulation operation performed when data is written in the simulation system according to the embodiment of the present invention.

FIG. 8 shows steps of performing a simulation operation in write mode. First a test pattern file 10 is read by a test master model 11 (step S11), and a test pattern is generated in accordance with the content of the read test pattern file 10 (step S12). The test pattern includes a command for causing the memory model 13 to carry out a write operation, a memory address, and write data, and these are supplied to the LSI model 12. The LSI model 12 interprets the contents of an instruction from the test master model 11 and executes the processing according thereto (step S13).

When a memory address is given, the LSI model 12 supplies the memory address to the memory model 13 in order to access the memory model 13. In this case, the lower 11 bits (page select address PA+column address MA) of the memory address are set in the memory module model 131 from the LSI model 12 (step S14). In the page write, the value of the column address MA usually represents the initial address in a page.

Next, the medium 9 bits (20:12) of the memory address are set in the comparison module 133 as an address TEST_ADDR for specifying an error generating position, and the higher 2 bits (23:22) thereof are set in the error control module 132 as an address TMA for specifying an operation mode (step S15).

The LSI model 12 calculates an ECC every time it receives write data (1 byte) (step S16). In other words, since the ECC is added to 512-byte data, it is calculated again every time new write data (1 byte) is received. The write data is then supplied to the memory module model 131. After that, the operation is performed in the memory model 13.

In the memory model 13, the comparison module 133 determines whether MA is equal to TEST_ADDR (step S17). If they are not equal to each other, the write data (1 byte) is written to the data register of the memory module model 131 as it is (step S19). If they are equal to each other, a bit-reversal operation according to the TMA is performed by the error control module 132 to generate error data (1 byte) (step S18), and the error data is written to the data register of the memory module model 131 (step S19).

After the value of the column address MA is updated by +1 (step S20), it is determined whether data of one page is completed in the data register (step S21). The reading of write data from the text pattern file, the calculation of ECC, and the writing to the data register are repeated until the data of one page is completed. When data of one page and its corresponding ECC are completed, they are written to the page specified by the page select address PA (step S22).

Since the ECC is created on the basis of write data to which no change has been made, the data and ECC are read out of a page to which error data is written and supplied to the LSI model 12, thereby verifying an error detecting/correcting function of the LSI model 12 when a memory error occurs.

Figure 9:
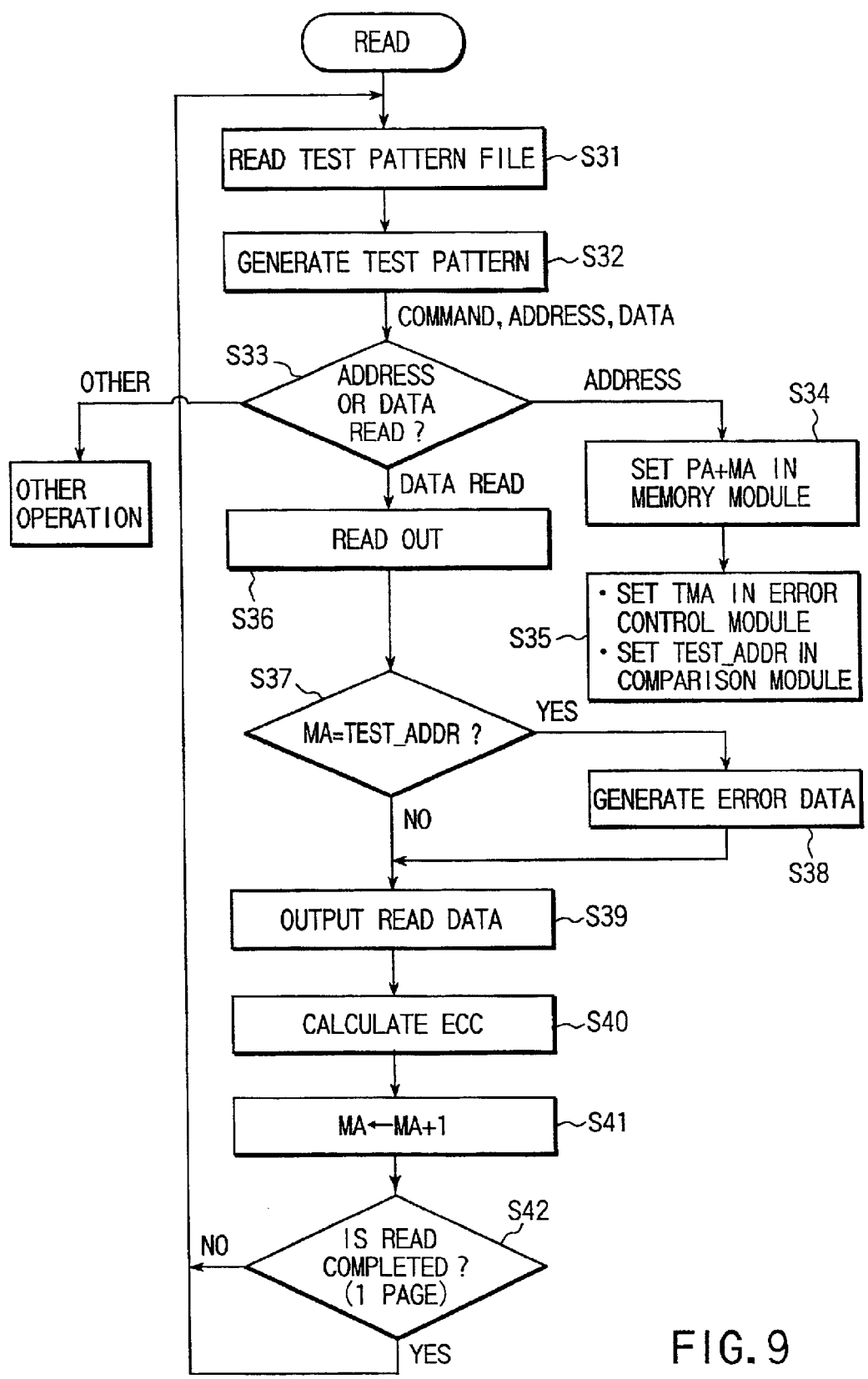
FIG. 9 is a flowchart showing a simulation operation performed when data is read in the simulation system according to the embodiment of the present invention.

FIG. 9 shows a simulation operation in read mode. First a test pattern file 10 is read by a test master model 11 (step S31), and a test pattern is generated in accordance with the content of the read test pattern file 10 (step S32). The test pattern includes a command for causing the memory model 13 to carrying out a read operation, a memory address, and expectation data for data to be read, and these are supplied to the LSI model 12. The LSI model 12 interprets the contents of an instruction from the test master model 11 and executes the processing according thereto (Step S33).

When a memory address is given, the LSI model 12 supplies the memory address to the memory model 13 in order to access the memory model 13. In this case, the lower bits (page select address PA+column address MA) of the memory address are set in the memory module model 131 from the LSI model 12 (step S34). In the page read, the value of the column address MA usually represents the initial address in a page.

Next, the medium 9 bits (20:12) of the memory address are set in the comparison module 133 as an address TEST_ADDR for specifying an error causing position, and the higher 2 bits (23:22) thereof are set in the error control module 132 as an address TMA for specifying an operation mode (step S35).

In response to an instruction from the LSI model 12, the memory model 13 starts reading data. In the page read, the memory module model 131 reads data (data+ECC) of one page, which is specified by the page select address PA, and supplies them to thy data register 202 together (step S36). Updating the column address MA by +1, data is read out of the data register 202 in units of one byte. In this case, in the memory model 13, the comparison module 133 determines whether MA is equal to TEST_ADDR (step S37). If they are not equal to each other, the read data (1 byte) is read from the memory model 13 to the LSI model 12 (step S39). If they are equal to each other, a bit-reversal operation according to the TMA is performed by the error control module 132 to generate error data (1 byte) (step S38), and the error data is read from the memory model 13 to the LSI model 12 (step S39).

Whenever the LSI model 12 receives read data, it generates an ECC therefrom (step S40). The ECC is compared with an ECC read out of the memory model 13 to detect and correct an error. After the value of the column address MA is updated by +1 (step S41), the memory model 13 determines whether data of one page is read out of the data register (step S42). This operation is repeated until the readout of data of one page is completed and, in this case, actually, the processing after step S37 is repeated.

When the readout of data of one page is completed, a new test pattern starts to be read out of the test pattern file.

As described above, in the read mode, too, an error can be generated on data read from any location when the need arises, and the error detecting/correcting function of the LSI model 12 can be verified when a memory error occurs.

The simulation method of the present embodiment is achieved by computer programs. If, therefore, the programs are recorded on a recording medium, such as a CD ROM, from which they can be read, a simulation operation can be performed on a normal computer. The memory model 13 of the present embodiment can be used versatilly as a memory model with an error generating function. In other words, using a normal memory model only for reading write data with reliability, to which the descriptions of the error control module 132 and comparison module 133 shown in FIG. 2 are added, the control of error generation can easily be performed by specifying a memory address.

In the foregoing embodiment, the simulation system is accomplished by computer programs; however, all the structures shown in FIGS. 1 and 2 can be done by hardware. In this case, a logic corresponding to the model, which has been described with reference to FIGS. 1 and 2, is mounted on a printed circuit board.

According to the present invention described above, a memory error can be generated by specifying a memory address, so that an error operation of the memory can easily be simulated, too. It is thus possible to correctly verify an operation of the LSI when a memory error occurs. Since, in particular, an error mode and an error causing position can be specified using a bit set other than that of a memory address used for simulating the memory operation an error can be generated in any position only by specifying the memory address.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of simulating an operation of memory, comprising:
supplying a memory address, which includes a first bit set for specifying a location to be accessed in a memory model and a second bit set for specifying an error address on which an error is to be generated, to the memory model describing the operation of the memory, thereby to simulate a read/write operation corresponding to the location specified by the first bit set of the memory address; and
generating an error in the read/write operation of the memory model by changing one of write data to be written to the memory model and read data read therefrom to error data, when a value of the first bit set coincides with a value of the error address specified by the second bit set.

2. The method according to claim 1, wherein the second bit set of the memory address includes error address information for specifying the error address and error mode information for specifying a content of error generation, and the generating includes:
detecting whether a value of the first bit set of the memory address and a value of the error address coincide with each other; and
reversing at least one bit of one of the write data and the read data in accordance with the error mode information when the value of the first bit set of the memory address and the value of the error address coincide with each other.

3. The method according to claim 1, wherein the memory model describes an operation of a nonvolatile semiconductor memory to which write data and an error correction code thereof are written in units of data size so as to correspond to each other, and the method further comprises simulating an error correcting operation of a memory controller for controlling the nonvolatile semiconductor memory, based on the read data and the error correction code, using an LSI model describing an operation of the memory controller.

4. The method according to claim 3, wherein the generating includes a first error mode for changing one of the write data to be written to the memory model and the read data read therefrom by the number of error correctablle bits using the error correction code and a second error mode for changing one of the write data and the read data by the number of bits exceeding the number of error correctable bits, one of the first error mode and the second error mode being chosen in accordance with the value of the second bit set of the memory address.

5. A system for simulating an operation of a memory comprising:
means for supplying a memory address, which includes a first bit set for specifying a location to be accessed in a memory model and a second bit set for specifying an error address on which an error is to be generated, to the memory model describing the operation of the memory, thereby to simulate a read/write operation corresponding to the location specified by the first bit set of the memory address, and
means for generating an error in the read/write operation of the memory model by changing one of write data to be written to the memory model and read data read therefrom to error data, when a value of the first bit set coincides with a value of the error address specified by the second bit set.

6. The system according to claim 5, wherein the second bit set of the memory address includes error address information for specifying the error address and error mode information for specifying a content of error generation, and the error generating means includes:
means for detecting whether a value of the first bit set of the memory address and a value of the error address coincide with each other, and
means for reversing at least one bit of one of the write data and the read data in accordance with the error mode information when the value of the first bit set of the memory address and the value of the error address coincide with each other.

7. The system according to claim 5, wherein the memory model describes an operation of a nonvolatile semiconductor memory to which write data and an error correction code thereof are written in units of data size so as to correspond to each other, and the system further comprises means for simulating an error correcting operation of a memory controller for controlling the nonvolatile semiconductor memory, based on the read data read from the memory model and the error correction code, using an LSI model describing an operation of the memory controller.

8. The system according to claim 7, wherein the error generating means includes a first error mode for changing one of the write data to be written to the memory model and the read data read therefrom by the number of error correctable bits using the error correction code and a second error mode for changing one of the write data and the read data by the number of bits exceeding the number of error correctable bits, one of the first error mode and the seconds error mode being chosen in accordance with the value of the second bit set of the memory address.

9. A program which is stored in a computer readable media and simulates an operation of a memory, the program comprising:
first code means for supplying a memory address, which includes a first bit set for specifying a location to be accessed in a memory model and a second bit set for specifying an error address on which an error is to be generated, to the memory model describing the operation of the memory, thereby to simulate a read/write operation corresponding to the location specified by the first bit set of the memory address; and second code means for generating an error in the read/write operation of the memory model by changing one of write data to be written to the memory model and read data read therefrom to error data, when a value of the first bit set coincides with a value of the error address specified by the second bit set.

10. The program according to claim 9, wherein the second bit set of the memory address includes error address information for specifying the error address and error mode information for specifying a content of error generation, and the second code means includes:

means for detecting whether a value of the first bit set of the memory address and a value of the error address coincide with each other; and means for reversing at least one bit of one of the write data and the read data in accordance with the error mode information when the value of the first bit set of the memory address and the value of the error address coincide with each other.

11. The program according to claim 9, wherein the memory model describes an operation of a nonvolatile semiconductor memory to which write data and an error correction code thereof are written in units of data size so as to correspond to each other, and the program further comprises third code means for simulating an error correcting operation of a memory controller for controlling the nonvolatile semiconductor memory, based on the read data read from the memory model and the error correction code, using an LSI model describing an operation of the memory controller.

12. The program according to claim 11, wherein the second code means includes a first error mode for changing one of the write data to be written to the memory model and the read data read therefrom by the number of error correctable bits using the error correction code and a second error mode for changing one of the write data and the read data by the number of bits exceeding the number of error correctable bits, one of the first error mode and the second error mode being chosen in accordance with the value of the second bit set of the memory address.

* * * * *

UNITED STATES PATENT AND TRADEMARK OFFICE
CERTIFICATE OF CORRECTION

PATENT NO.    : 6,820,047 B1
DATED         : November 16, 2004
INVENTOR(S)   : Aizawa et al.

It is certified that error appears in the above-identified patent and that said Letters Patent is hereby corrected as shown below:

<u>Column 10,</u>
Line 60, change "seconds" to -- second --.

Signed and Sealed this

Eighth Day of March, 2005

JON W. DUDAS
*Director of the United States Patent and Trademark Office*